United States Patent
Groom et al.

(10) Patent No.: US 10,446,959 B2
(45) Date of Patent: Oct. 15, 2019

(54) PRINTED CIRCUIT BOARD MOUNTED CABLE APPARATUS AND METHODS THEREOF

(71) Applicant: Seagate Technology LLC, Cupertino, CA (US)

(72) Inventors: Timothy Groom, Southsea (GB); David Michael Davis, Portsmouth (GB)

(73) Assignee: Seagate Technology LLC, Cupertino, CA (US)

( * ) Notice: Subject to any disclaimer, the term of this patent is extended or adjusted under 35 U.S.C. 154(b) by 63 days.

(21) Appl. No.: 15/799,071

(22) Filed: Oct. 31, 2017

(65) Prior Publication Data
US 2019/0131729 A1     May 2, 2019

(51) Int. Cl.
| H01R 24/00 | (2011.01) |
| H01R 33/00 | (2006.01) |
| H01R 12/70 | (2011.01) |
| H01R 12/71 | (2011.01) |
| H01R 13/518 | (2006.01) |
| H05K 5/00 | (2006.01) |

(52) U.S. Cl.
CPC ..... *H01R 12/7082* (2013.01); *H01R 12/7064* (2013.01); *H01R 12/716* (2013.01); *H01R 13/518* (2013.01); *H05K 5/00* (2013.01)

(58) Field of Classification Search
CPC ........ H01R 24/00; H01R 24/60; H01R 24/62; H01R 13/6594; H01R 13/6595; H01R 12/00; H01R 12/7035; H01R 12/7082; H01R 12/716

USPC .............. 439/660, 607.07, 567, 571
See application file for complete search history.

(56) References Cited

U.S. PATENT DOCUMENTS

| 4,679,869 | A | * | 7/1987 | Watson ................ H01R 13/518 439/78 |
| 5,710,851 | A | | 1/1998 | Walter et al. |
| 5,924,899 | A | * | 7/1999 | Paagman ............. H01R 23/688 439/620.09 |
| 6,083,047 | A | * | 7/2000 | Paagman ........... H01R 13/6587 439/607.07 |
| 6,331,079 | B1 | * | 12/2001 | Grois ................... G02B 6/3821 385/53 |
| 6,370,769 | B1 | | 4/2002 | Lilienthal, II |
| 6,592,401 | B1 | * | 7/2003 | Gardner ............... G02B 6/3817 439/101 |
| 6,884,117 | B2 | * | 4/2005 | Korsunsky ......... H01R 13/6585 439/607.11 |
| 7,148,428 | B2 | | 12/2006 | Meier et al. |

(Continued)

*Primary Examiner* — Hae Moon Hyeon
(74) *Attorney, Agent, or Firm* — Mueting, Raasch & Gebhardt, P.A.

(57) ABSTRACT

A system, apparatus, and method including a cable apparatus that is configured to be physically coupled to a printed circuit board. The cable apparatus includes a cable connector including at least one prong configured to be coupled within an aperture of the printed circuit board and an opening configured to receive an additional connector. The cable apparatus also includes a plurality of flexible cables coupled to the cable connector. Connecting portions of each of the plurality of flexible cables positioned within the opening of the receiving housing and configured to be operably coupled to the additional connector. The at least one prong does not transmit a signal into the printed circuit board and is configured to be press-fit within the aperture of the printed circuit board.

20 Claims, 7 Drawing Sheets

(56) References Cited

U.S. PATENT DOCUMENTS

| | | | |
|---|---|---|---|
| 8,338,713 B2 | 12/2012 | Fjelstad et al. | |
| 8,430,692 B2 | 4/2013 | Peng et al. | |
| 8,449,330 B1 * | 5/2013 | Schroll | H01R 13/514 |
| | | | 439/607.06 |
| 8,517,765 B2 * | 8/2013 | Schroll | H01R 13/6586 |
| | | | 439/108 |
| 8,529,277 B2 | 9/2013 | Williams et al. | |
| 8,845,364 B2 * | 9/2014 | Wanha | H01R 13/516 |
| | | | 439/607.07 |
| 9,281,636 B1 * | 3/2016 | Schmitt | H01R 13/7175 |
| 2005/0118864 A1 * | 6/2005 | Watanabe | H01R 12/585 |
| | | | 439/567 |
| 2007/0254502 A1 * | 11/2007 | Horikiri | H01R 12/592 |
| | | | 439/79 |
| 2014/0078664 A1 * | 3/2014 | Lau | H01R 12/716 |
| | | | 361/679.33 |
| 2017/0125950 A1 * | 5/2017 | Lloyd | H01B 11/00 |
| 2018/0287314 A1 * | 10/2018 | Rothermel | H01R 24/60 |

* cited by examiner

PRINTED CIRCUIT BOARD MOUNTED CABLE APPARATUS AND METHODS THEREOF

The disclosure herein relates generally to connectors configured to transmit signals (e.g., high-speed signals, low-speed signals, power signals, etc.) relative to a printed circuit board. Specifically, signals may be transmitted between modules located on the printed circuit board and connectors. Additionally, the connector may mate with a complementary connector to transmit the signal therefrom.

SUMMARY

An exemplary cable apparatus configured to be physically coupled to a printed circuit board may include a cable connector and a plurality of flexible cables. The cable connector may include an attachment apparatus and a receiving housing, the attachment apparatus may include at least one prong configured to be coupled within an aperture of the printed circuit board (e.g., the at least one prong may be configured to be press-fit within the aperture of the printed circuit board). The at least one prong may not transmit a signal into the printed circuit board. The receiving housing may define an opening configured to receive an additional connector. The plurality of flexible cables (e.g., electrical cables, optical cables, etc.) may be coupled to the cable connector. Each of the plurality of flexible cables may extend from an end portion including a connecting portion. The connecting portions may be positioned within the opening of the receiving housing (e.g., along a longitudinal axis) and configured to be operably coupled to a corresponding connecting portion of the additional connector received by the opening of the receiving housing.

An exemplary system may include a printed circuit board, a cable connector, and a plurality of flexible cables. The printed circuit board may define a top surface, an opposing bottom surface, and an edge surface extending between the top and bottom surfaces. The printed circuit board may further define an aperture (e.g., an electrically plated aperture) extending into the top surface of the printed circuit board. The cable connector may include at least one prong configured to be coupled within the aperture of the printed circuit board and may define an opening configured to receive an additional connector. The plurality of flexible cables may be coupled to the cable connector. Each of the plurality of flexible cables may extend from an end portion including a connecting portion. The connecting portions may be positioned within the opening of the receiving housing and configured to be operably coupled to the additional connector received by the opening of the receiving housing.

An exemplary method may include coupling a plurality of flexible cables to an attachment apparatus, coupling the attachment apparatus to a receiving housing, and coupling the attachment apparatus within an aperture of a printed circuit board. The plurality of flexible cables may be coupled to the attachment apparatus between a first end portion and a second end portion of the attachment apparatus. The attachment apparatus may include opposing attachment edges extending between the first and second end portions and at least one prong extending from one of the opposing attachment edges. Each of the plurality of flexible cables may extend from an end portion including a connecting portion. The receiving housing may define an opening and may be coupled to the attachment apparatus such that the connecting portions are positioned within the opening. The opening of the receiving housing may be configured to receive an additional connector to operably couple the additional connector and the plurality of flexible cables.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

DETAILED DESCRIPTION

Figure 1:
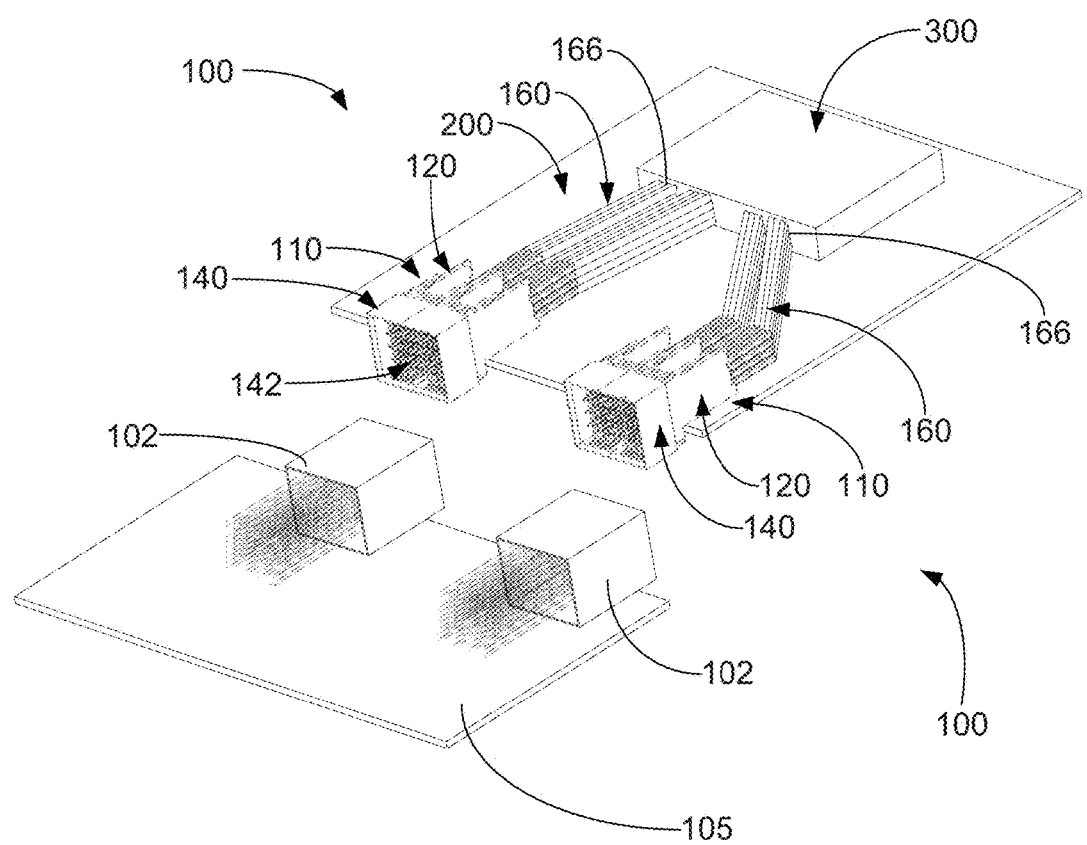
FIG. 1 is a perspective view of a pair of exemplary cable apparatus coupled to a printed circuit board and aligned with additional connectors.

The present disclosure relates to physically coupling a cable connector to a printed circuit board (PCB) and the cable connector is configured to connect a plurality of flexible cables (e.g., optical, electrical, etc.) to another connector, a PCB assembly, other flexible cables, etc. More specifically, the present disclosure relates to systems, apparatus, structures, and methods for physically coupling a cable connector into vias (e.g., existing or later defined) of a PCB to provide signal (e.g., high-speed signal, low-speed/ static signal, power signal, etc.) transfer through a plurality of cables that are separate from electrical traces, optical waveguides or other layers of the PCB. The cable connector may be any suitable connector for connecting cables, but may be mounted using at least one prong that may extend from a portion of the cable connector, which may be configured to be coupled within an aperture or via of the PCB.

Current systems may include a connector that is coupled to a PCB such that signals received or transmitted by the connector are received and transmitted onto a set of PCB traces (or, e.g., electrical/optical layers) embedded in (or on) the surface of the PCB, and then out of the PCB traces to a different connector or device mounted on the PCB. Each of the connectors may be operably connected to a different module so that the modules may, e.g., transfer signals between each other through the PCB traces. As the signal speed increases, the distance that the signals may travel in the PCB traces may decrease (e.g., to maintain a higher speed) due to the frequency dependent losses (e.g., resistance) of the PCB traces. In other words, the signal speed and distance traveled through the PCB traces or layers may be inversely proportional (e.g., due to limitations of the PCB) such that an increase in signal speed limits the total distance the signal may travel through the PCB traces and vice versa. As such, the PCB traces or layers may not be able to accommodate high-speed signals over large distances. Further, the use of connectors to transfer signals from a module and into the PCB traces may result in a disruption or degradation to the signal because of, e.g., a weak connection (physical or otherwise) between the connector and the PCB trace that may create discontinuities in the signal or signal "stubs." Further yet, an increase in the number of connections/transitions may also contribute to a signal loss or disturbance. As described herein, a high-speed signal may be defined as, e.g., defining a fast rise or fast fall speeds. In some embodiments, the high-speed signal may be defined as having a speed, e.g., greater than or equal to 1 GHz.

The exemplary systems and apparatus described herein may utilize the properties provided by cable to transfer high-speed signals over a greater distance than using PCB material (e.g., traces or layers). In other words, to minimize signal loss and discontinuities, the cable apparatus and systems described herein may not transition from cable to PCB traces through a connector, but instead transition from cable to connector (e.g., which is physically coupled to a PCB) to another cable. Therefore, the cables may define a greater maximum distance the signal may travel as compared to traces/layers of PCBs and their associated connectors. The PCB may be only used for support and location of the cable connector so that the high-speed signals may be transmitted only through cable to provide, e.g., a more robust signal transfer and transmission, an improved signal integrity, a reduced PCB cost (e.g., because the need for high-speed routing layers from the PCB may be removed), etc. The cables may then be connected to any suitable module (e.g., data storage device, computer processor, server, protocol switch, fan out device, etc.) with the benefit of a more stable signal.

Exemplary systems, apparatus, structures, devices, and methods shall be described with reference to FIGS. 1-6. It will be apparent to one skilled in the art that elements or processes from one embodiment may be used in combination with elements or processes of the other embodiments, and that the possible embodiments of such systems, apparatus, structures, devices, and methods using combinations of features set forth herein is not limited to the specific embodiments shown in the figures and/or described herein. Further, it will be recognized that timing of the processes and the size and shape of various elements herein may be modified but still fall within the scope of the present disclosure, although certain timings, one or more shapes and/or sizes, or types of elements, may be advantageous over others.

An exemplary cable apparatus 100 configured to be coupled (e.g., physically coupled) to a printed circuit board 200 is shown in FIG. 1 (it is noted that two separate cable apparatus 100 are depicted in FIG. 1). The cable apparatus 100 may include a cable connector 110 and a plurality of flexible cables 160. The cable connector 110 may be configured to attach the plurality of flexible cables 160 to the printed circuit board 200. Furthermore, the cable connector 110 may be configured to receive, or mate with, an additional connector 102 to, e.g., operably connect the plurality of flexible cables 160 to the additional connector 102 (e.g., such that signals may be transmitted between the plurality of flexible cables 160 and the additional connector 102 and, in turn, a plurality of cables or a device operably coupled to the additional connector 102).

The additional connector 102 may be arranged in any suitable way or include any suitable structure to connect with the cable apparatus 100 (e.g., the cable connector 110). For example, the additional connector 102 may be free-standing (e.g., not physically coupled to anything other than cables extending therefrom) such that the additional connector 102 may be connected to the cable apparatus 100 and may, e.g., include flexible cables extending therefrom towards any desired location (e.g., a portion of flexible cables is shown extending from the additional connectors 102 illustrated in FIG. 1). In one or more embodiments, the additional connector 102 may be electrically or optically coupled to a second printed circuit board 105 and connected to the cable apparatus 100 such that signal through the additional connector 102 travels through traces in the second printed circuit board 105. In other words, the cable apparatus 100 (for which the plurality of flexible cables 160 extends therefrom) may be connected to the additional connector 102 that is electrically coupled to the second printed circuit board 105 such that the signal travels between the plurality of flexible cables 160 and traces in the second printed circuit board 105.

Also, in some embodiments, the system may include two cable apparatus 100 connected or mated to one another. For example, two cable connectors 110 may be physically coupled to a different printed circuit board (e.g., the printed circuit board 200 and the second printed circuit board 105), as described further herein, and connected to one another. As such each of the two cable connectors 110 may be physically coupled to a corresponding printed circuit board for location and stability, and the plurality of flexible cables 160 associated with each of the cable connectors 110 may be operably connected to each other through mating of the cable connectors 110. In other words, the two cable apparatus 100 may be connected to each other such that signals may be transmitted between one set of the plurality of flexible cables 160 (e.g., extending from the first cable connector 110) and the other set of the plurality of flexible cables 160 (e.g., extending from the second cable connector 110). In other embodiments, two cable connectors 110 may be physically coupled to the same printed circuit board and connected to one another by a plurality of flexible cables 160 (e.g., connected to one another outside of or above the printed circuit board 200). In such embodiments, each of the two cable connectors 110 may be configured to mate with an additional connector 102.

The cable connector 110 may include an attachment apparatus 120 that may assist in coupling the cable connector 110 to the printed circuit board 200 (e.g., as a part of, removably coupled to, coupled to, etc.) and a receiving housing 140 positioned adjacent the attachment apparatus 120 and configured to "house" ends of the plurality of flexible cables 160. The receiving housing 140 may also be configured to receive or mate with the additional connector 102. For example, the receiving housing 140 may define an opening 142 configured to receive the additional connector 102. The receiving housing 140 may provide the structure and interface for which the plurality of flexible cables 160 and the additional connector 102 are operably connected. In some embodiments, the attachment apparatus 120 and the receiving housing 140 may be one integral component or structure. In other embodiments, the attachment apparatus 120 and the receiving housing 140 may be separate components or structures (that are, e.g., coupled together).

The plurality of flexible cables 160 may include any suitable cable that may be configured for signal and/or power transmission. For example, the plurality of flexible cables 160 may include optical cables, electrical cables, peripheral component interconnect express (PCIe), Serial Attached small computer system interface (SCSI), Ethernet, universal serial bus (USB), etc. and may include any suitable cable now known, or later developed, in the art. It is noted that the plurality of cables 160 are described as "flexible," but, may define any degree of flexibility or rigidity that is suitable. In one or more embodiments, the plurality of flexible cables 160 may be ribbonised or bundled together in groups or sets (e.g., in whole or in portions) for each cable connector 110 through which the plurality of flexible cables 160 are positioned. In other words, each flexible cable that is "ribbonised" or "bundled" may be touching at least one other flexible cable or within less than or equal to 5 mm, less than or equal to 3 mm, less than or equal to 2 mm, less than or equal to 1 mm of at least one other flexible cable. Specifically, the pitch of the flexible cables (e.g., the distance between each cable) may be around 2 mm to, e.g., match the pitch of the connector contacts and facilitate assembly of the ribbonised cable. In some embodiments, the plurality of flexible cables 160 may only be bundled proximate the attachment apparatus 120, e.g., more than or equal to 1 cm or more than or equal to 2 cm of the attachment apparatus 120. For example, this may ensure that the bundle is clear of the connector before it begins its routing in the system (which, e.g., may be tortuous, may include many bends, or may even allow movement in the system due to drawers or something similar thereto).

The plurality of flexible cables 160 may be a combination of any number of individual cables that may be suitable for the application. For example, the plurality of flexible cables 160 may include 1, 4, 8, 16, 24, 32, etc. different individual cables. Each of the cables may be configured for transmitting or receiving signals and any combination of individual cables may be configured for either of transmitting or receiving. In some embodiments, at least some (if not all) of the plurality of flexible cables 160 may be configured to both transmit and receive signals.

The plurality of flexible cables 160 may extend from the cable connector 110 and towards any variety of modules that may include a wired connection. For example, the plurality of flexible cables 160 may be connected to a module 300 as illustrated in FIG. 1. In one or more embodiments, the plurality of flexible cables 160 may be connected to a module 300 such as, e.g., a data storage device, a power source, a computer processor, a server, a protocol switch, a fan out device, etc. It is noted that in FIG. 1, all of the plurality of flexible cables 160 are connected to the module 300, however, in some embodiments, different combinations of the plurality of flexible cables 160 may be connected to different modules or other connectors. Extending the plurality of flexible cables 160 directly between the cable connector 110 and the module 300 may improve the quality of the signal because, e.g., the signal does not travel through multiple interfaces by traveling into and out of traces/layers in a printed circuit board. Further, as described herein, the plurality of flexible cables 160 may define a greater maximum speed and/or transmission distance than may be accomplished through traces/layers of printed circuit boards. For example, the plurality of flexible cables 160 may define a greater maximum distance than may be accomplished through traces/layers of the printed circuit boards and their associated connectors. In other embodiments, the plurality of flexible cables 160 may be connected to another connector (e.g., on the same or different printed circuit board 200 as the cable connector 110).

Figure 2A:
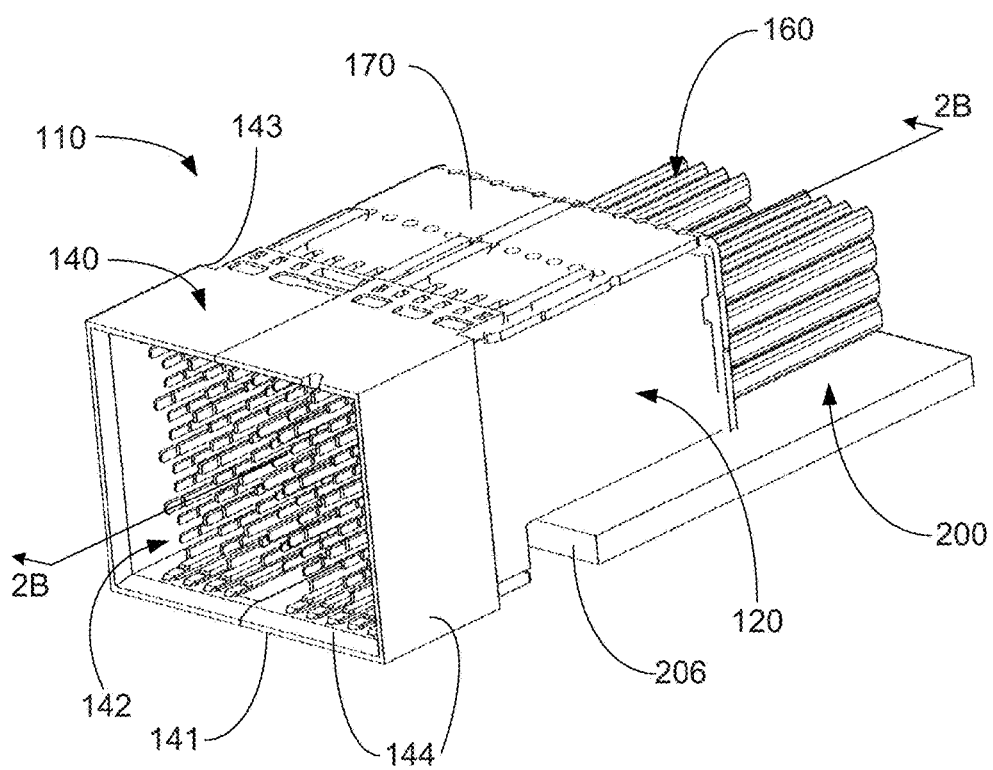
FIG. 2A is an enlarged perspective view of one exemplary cable apparatus of FIG. 1.
Figure 2B:
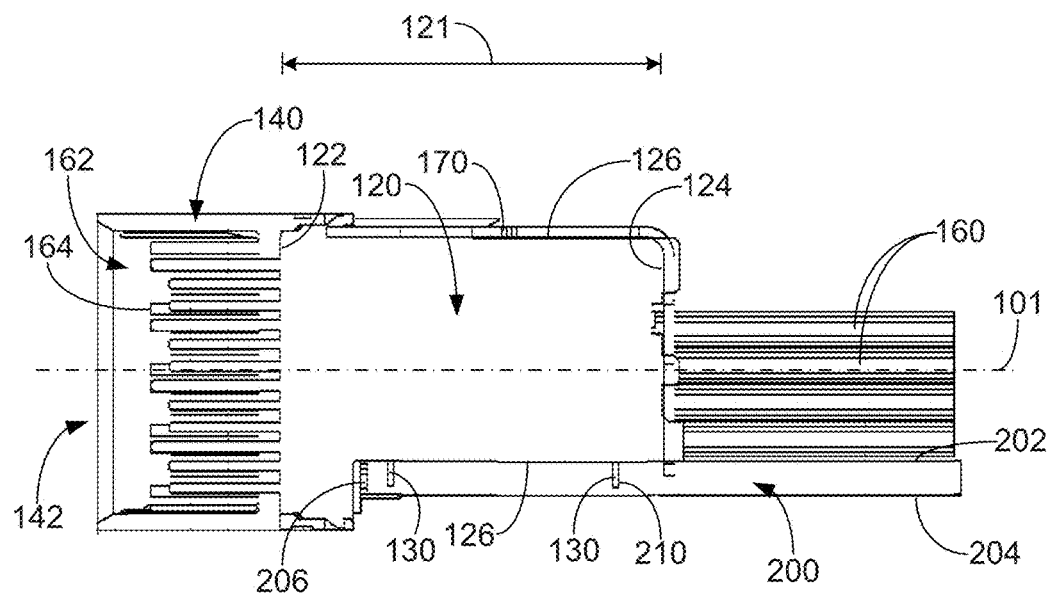
FIG. 2B is a cross-sectional view of the exemplary cable apparatus of FIG. 2A taken across line 2B-2B.

An enlarged perspective view of the cable apparatus 100 is illustrated in FIG. 2A and a cross-section of the cable apparatus 100 taken across line 2B-2B (of FIG. 2A) is illustrated in FIG. 2B. Each flexible cable of the plurality of flexible cables 160 may be positioned such that an end of the flexible cable may be located within the receiving housing 140 and extend outward therefrom (e.g., along a longitudinal axis 101). For example, each flexible cable of the plurality of flexible cables 160 may extend from an end portion 162 that includes a connecting portion 164 and may extend within the receiving housing 140 along the longitudinal axis 101. The connecting portion 164 of each of the plurality of flexible cables 160 may be configured to mate with other cables or connectors. For example, the connecting portion 164 of each of the plurality of flexible cables 160 may include exposed wire, contact portions, openings, guides (e.g., configured to align the cables), latches (e.g., configured to retain the cables), etc. The portion 166 (e.g., as shown in FIG. 1) of each of the plurality of flexible cables 160 opposite the end portion 162 may be connected to any suitable module, as described herein, or another cable connector 110 (e.g., whether physically coupled to the printed circuit board 200, as described herein, or not).

The receiving housing 140 of the cable connector 110 may extend between a first end 141 and a second end 143 and may define the opening 142 extending through the receiving housing 140 between the first and second ends 141, 143. In other words, the opening 142 of the receiving housing 140 may be a passageway (e.g., extending along the longitudinal axis 101) through the receiving housing 140 between at least a portion of the first and second ends 141, 143. The receiving housing 140 may also include outer walls 144 that extend between the first and second ends 141, 143 (e.g., along the longitudinal axis 101) and define the opening 142. The receiving housing 140 may include any number of outer walls 144 that is suitable to, e.g., interact with the attachment apparatus 120, provide guidance for the additional connector 102, etc. For example, the receiving housing 140 illustrated in FIG. 2A includes four outer walls 144 that define a quadrilateral shape and a quadrilateral-shaped opening 142.

The plurality of flexible cables 160 may positioned through the second end 143 of the receiving housing 140 (e.g., in the opening 142) such that the connecting portions 164 of the plurality of flexible cables 160 are located within the opening 142 of the receiving housing 140. In other words, the receiving housing 140 may support the connecting portions 164 of the plurality of flexible cables 160. Similarly, the additional connector 102 may be connected to the cable connector 110 proximate the first end 141 of the receiving housing 140 (e.g., through the opening 142). In other words, the additional connector 102 may be operably coupled to (e.g., received by or mated with) the cable connector 110 through the opening 142 of the receiving housing 140 opposite the plurality of flexible cables 160.

The attachment apparatus 120 may extend between a first end portion 122 and a second end portion 124 (e.g., along the longitudinal axis 101) and may include opposing attachment edges 126 extending between the first and second end portions 122, 124. The attachment apparatus 120 may be positioned relative to the receiving housing 140 such that the first end portion 122 is located closer to the receiving housing 140 than the second end portion 124. In some embodiments, the first end portion 122 of the attachment apparatus 120 may be positioned within the receiving housing 140 (e.g., through the second end 143 of the receiving housing 140). The attachment apparatus 120 may be couplable to or integral with the receiving housing 140. Further, one of the opposing attachment edges 126 may be positioned adjacent to the printed circuit board 200. For example, in some embodiments, the attachment edge 126 adjacent the printed circuit board 200 may be shaped to extend along the contour of the printed circuit board 200 such that the attachment apparatus 120 may be "flush" against the printed circuit board 200.

The attachment apparatus 120 may define a length 121 that is measured between the first end portion 122 and the second end portion 124. The length 121 may be any suitable distance such that the attachment apparatus 120 may be appropriately affixed to the printed circuit board 200. For example, the length 121 of the attachment apparatus 120 may be about greater than or equal to 20 mm, greater than or equal to 30 mm, greater than or equal to 40 mm, etc. and/or less than or equal to 70 mm, less than or equal to 50 mm, less than or equal to 45 mm, less than or equal to 35 mm, etc. measured between the first and second end portions 122, 124. In some embodiments, the length 121 of the attachment apparatus 120 may depend on the number and gauge of the cables in the cable connector 110. In one or more embodiments, the plurality of flexible cables 160 may extend along the attachment apparatus 120 between the first and second end portions 122, 124 of the attachment apparatus 120. For example, the plurality of flexible cables 160 may be attached to the attachment apparatus 120 (e.g., via fasteners) to provide support and structure for the plurality of flexible cables 160 (e.g., proximate the receiving housing 140). In other embodiments, the attachment apparatus 120 may define a shorter length (e.g., less than or equal to 2 cm) to allow for the plurality of flexible cables 160 to bend along the printed circuit board 200 (e.g., while remaining proximate the top surface 202) at a location closer to the receiving housing 140 to, e.g., provide increased flexibility to the plurality of flexible cables 160 away from the attachment apparatus 120.

The cable apparatus 100 may include any number of attachment apparatus 120 to support the cable connector 110 to the printed circuit board 200. For example, the cable apparatus 100 may include one, two, three, four, etc. attachment apparatus 120. Specifically, as shown in FIG. 2A, the cable apparatus 100 includes four attachment apparatus 120. The attachment apparatus 120 may be, e.g., evenly spaced, positioned in the center of the cable connector 110, positioned on the outsides of the cable connector 110 (e.g., such that the plurality of flexible cables 160 are between the attachment apparatus 120), or any combination thereof to, e.g., provide support, retention, and physical separation of the plurality of flexible cables 160.

As shown in FIG. 2B, the attachment apparatus 120 includes at least one prong 130 configured to physically couple the cable connector 110 to the printed circuit board 200. Specifically, the at least one prong 130 may be configured to be coupled within an aperture 210 (e.g., a hole, a via, etc.) of the printed circuit board 200. The at least one prong 130 may extend from the attachment apparatus 120 such that the at least one prong 130 may be inserted into the aperture 210. For example, in one or more embodiments, the at least one prong 130 may extend perpendicular to one of the opposing attachment edges 126 of the attachment apparatus 120. Further, it may be described that the at least one prong 130 extends perpendicular to the longitudinal direction of the plurality of flexible cables 160 (e.g., perpendicular to the longitudinal axis 101) extending through the cable connector 110. In other embodiments, the at least one prong 130 may extend parallel to the longitudinal axis 101. The at least one prong 130 may extend away from the attachment apparatus 120 by any suitable distance. For example, the at least one prong 130 may extend away from the attachment apparatus 120 by about greater than or equal to 0.5 mm, greater than or equal to 1 mm, greater than or equal to 2 mm, etc. and/or less than or equal to 5 mm, less than or equal to 4 mm, less than or equal to 3 mm, etc. The attachment apparatus 120 may include any number of prongs 130 suitable for physically coupling the attachment apparatus 120 to the printed circuit board 200. For example, as shown in FIG. 2B, the at least one prong 130 includes two prongs.

The printed circuit board 200 may define a top surface 202, a bottom surface 204, and an edge surface 206 extending between the top and bottom surfaces 202, 204. The printed circuit board 200 may define the aperture 210 extending into the top surface 202 of the printed circuit board 200. For example, the aperture 210 may extend into the top surface 202 of the printed circuit board 200, but not pass through the printed circuit board 200 (e.g., not extend all the way to the bottom surface 204 of the printed circuit board 200). In one or more embodiments, the aperture 210 may extend through the printed circuit board 200 between the top and bottom surfaces 202, 204.

The at least one prong 130 of the attachment apparatus 120 and the corresponding aperture 210 may be any suitable shape or size such that the at least one prong 130 may be positioned within the aperture 210. In one or more embodiments, the at least one prong 130 may be "press-fit" into the aperture 210 to secure the at least one prong 130 within the aperture 210 to, e.g., affix the cable connector 110 to the printed circuit board 200. In other words, the at least one prong 130 may define a cross-sectional area that is slightly larger than the cross-sectional area of the aperture 210 such that when the at least one prong 130 is pushed or forced under pressure into the aperture 210, an interference fit may be formed between the at least one prong 130 and the aperture 210. In other embodiments, the at least one prong 130 may be screwed into the aperture 210. As such, the at least one prong 130 may be "press-fit" or screwed into the aperture and may secure the cable connector 110 and the printed circuit board 200 together in a robust way. In other words, the at least one prong 130 may be coupled to the printed circuit board 200 by being inserted into the printed circuit board 200, and the at least one prong 130 may restrict movement of the cable connector 110 relative to the printed circuit board 200.

Because the at least one prong 130 may be press-fit into the aperture 210, the cable apparatus 100 may be described as easier to repair if, e.g., one of the plurality of flexible cables 160 becomes faulty. For example, if the prong was soldered into place, the prong and/or printed circuit board may be damaged due to the heat and processing needed to remove the prong. On the other hand, the at least one prong 130 that is press-fit may be, e.g., pulled out and aperture 210 (e.g., the via or hole) may be re-used. Additionally, the at least one prong 130 may be arranged on the attachment apparatus 120 in specific way (e.g., in a pattern) to facilitate locating the attachment apparatus relative to the printed circuit board 200. In other embodiments, the attachment apparatus 120 may define a threaded hole that is configured to allow screws to pass through the printed circuit board 200 and into the attachment apparatus 120 to retain the cable connector 110 to the printed circuit board 200.

In one or more embodiments, the aperture 210 may be a via that provides an electrical/optical connection to a trace or layer of the printed circuit board 200. For example, the aperture 210 may be configured to conduct an electrical/optical signal between something inserted into the aperture 210 and the trace or layer of the printed circuit board 200. Specifically, the aperture 210 of the printed circuit board 200 may be electrically/optically plated or conductive (or, e.g., thermally conductive). However, in some embodiments, the aperture 210 may not be electrically/optically plated or conductive (e.g., the aperture may include an insulative material).

In one or more embodiments, the at least one prong 130 may not transmit a signal (e.g., an electrical signal, an optical signal, etc.) into the printed circuit board 200 when inserted into the aperture 210. For example, even though the aperture 210 may be electrically plated/optically configured, the at least one prong 130 may not be configured to transmit a signal through the aperture 210 and into the printed circuit board 200. In other words, the insertion of the at least one prong 130 into the aperture 210 may only provide proper positioning and coupling of the cable connector 110 relative to the printed circuit board 200 and provide stability between the printed circuit board 200 and the cable connector 110—and not provide an interface (e.g., electrical, optical, or otherwise) between the cable connector 110 and the printed circuit board 200. However, in other embodiments, the at least one prong 130 may transmit some low-speed signals, presence signals, power, etc. through the printed circuit board 200.

Figure 3:
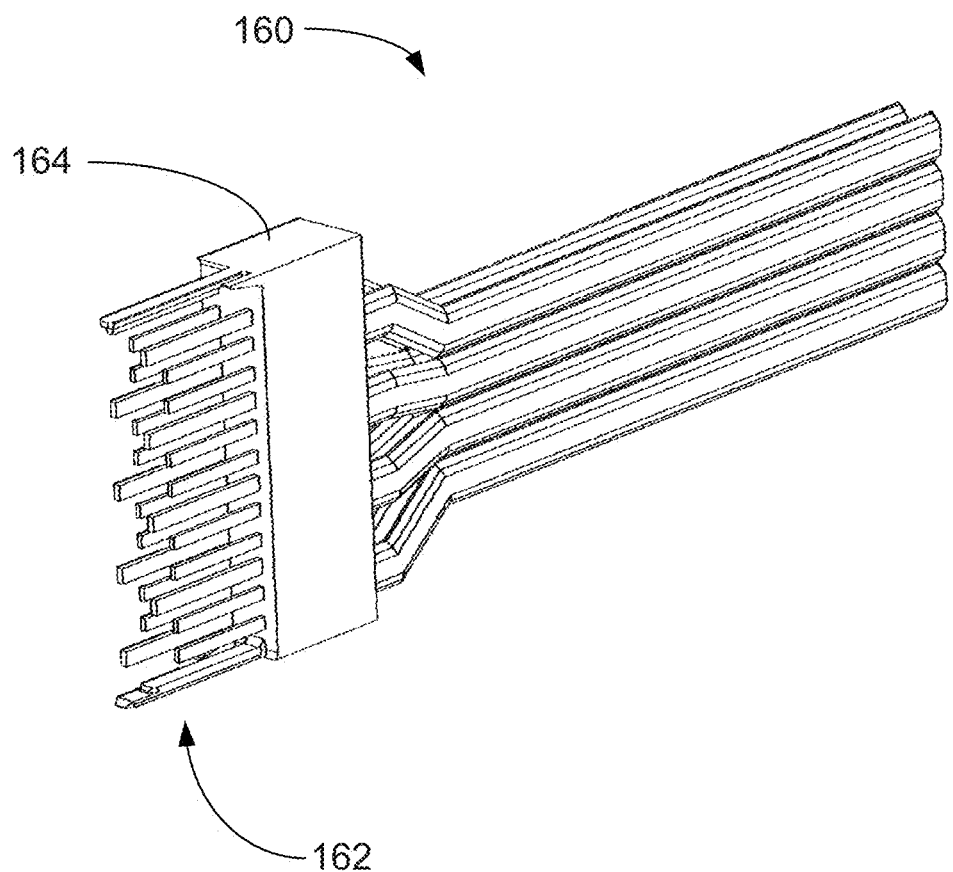
FIG. 3 is a perspective view of a plurality of flexible cables.

In one or more embodiments, the plurality of flexible cables 160 may bundled together for at least a portion of the length of the plurality of flexible cables 160. In some embodiments, the plurality of flexible cables 160 may extend along a width proximate the end portion 162 (e.g., to accommodate the connecting portion 164), as shown in FIG. 3. In other words, the plurality of flexible cables 160 may be spread out at the connecting portion 164 to provide enough space for the connecting portion 164 to be operably coupled to some other component or connector. Further, the plurality of flexible cables 160 that extend from the connecting portion 164 may be adjacent one another (e.g., ribbonised or bundled) at a distance from the connecting portion 164 to, e.g., minimize the space utilized by the plurality of flexible cables 160 and allow for easier handling and/or routing. As such, the plurality of cables 160 may define a greater width at the connecting portion 164 than the remainder of the plurality of cables 160 as shown in FIG. 3.

Figure 4:
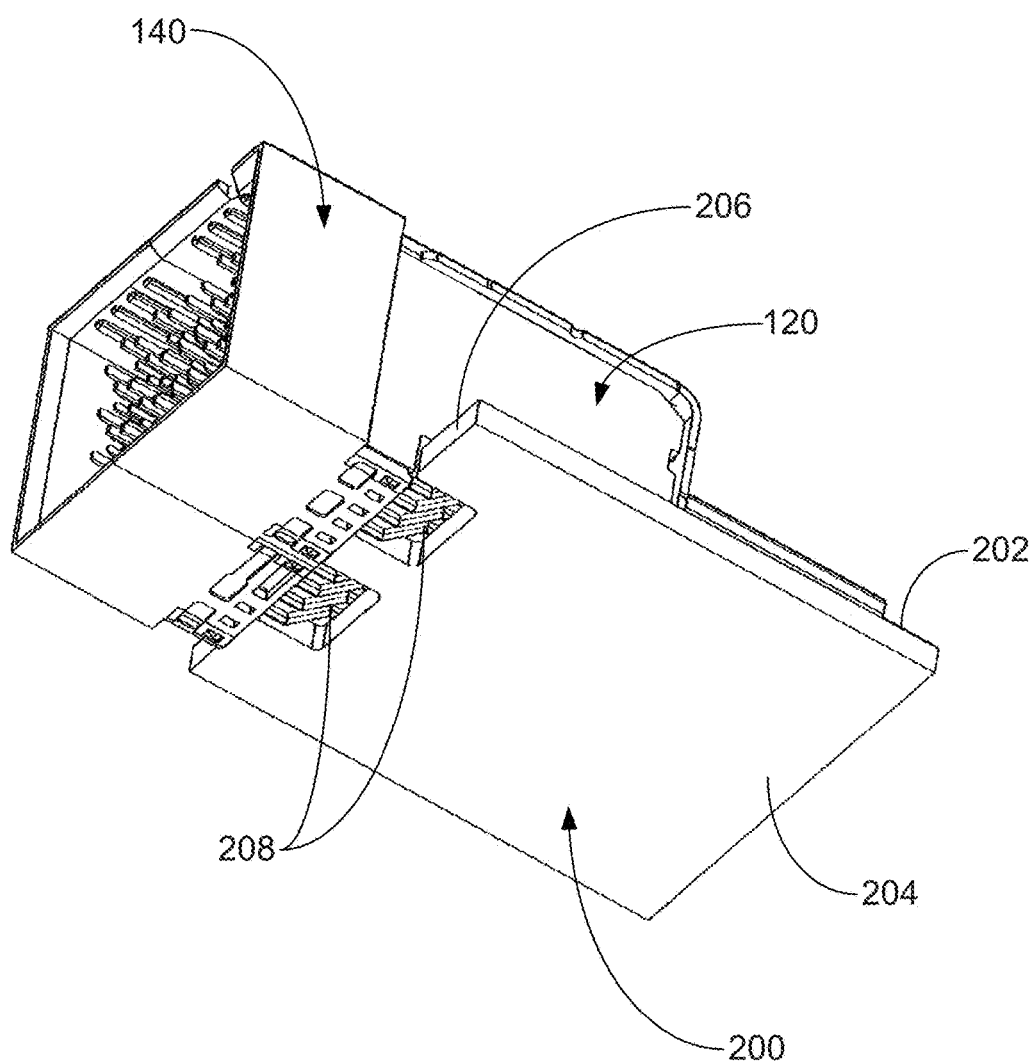
FIG. 4 is a bottom perspective view of another embodiment of an exemplary cable apparatus.

Furthermore, the printed circuit board 200 may define a notch 208 extending into the printed circuit board 200 from the edge surface 206 of the printed circuit board 200 as illustrated in FIG. 4. The notch 208 in the printed circuit board 200 may allow the plurality of flexible cables 160 to be positioned such that the connecting portion 164 is located within the notch 208 of the printed circuit board 200 and the remainder of the plurality of flexible cables 160 are positioned above the top surface 202 of the printed circuit board 200. Further, at least a portion of the cable connector 110 (e.g., the receiving housing 140 that contains the connecting portion 164) may be positioned within the notch 208. As a result, the plurality of flexible cables 160 may be positioned proximate the top surface 202 of the printed circuit board 200. Specifically, at least one of the flexible cables of the plurality of flexible cables 160 may be adjacent the top surface 202 of the printed circuit board 200. In other words, the width difference (e.g., offset) between the connecting portion 164 of the plurality of flexible cables 160 and the remainder of the plurality of flexible cables 160 may be accommodated such that the plurality of flexible cables 160 may be "flush" against or extend along the top surface 202 of the printed circuit board 200 (e.g. at least proximate the attachment apparatus 120). In other embodiments, the printed circuit board 200 may be modified (e.g., with notches) to accommodate various different types of cable connectors.

In one or more embodiments, cable apparatus 100 may further include a stiffener structure 170 as shown in FIG. 2A. The stiffener structure 170 may be configured to guide the plurality of flexible cables 160 along the printed circuit board 200. For example, the stiffener structure 170 may be positioned to extend along the plurality of flexible cables 160 (e.g., above and parallel with the cables) to retain rigidity along the plurality of flexible cables 160 beyond the attachment apparatus 120. Also, for example, the stiffener structure 170 may define a surface perpendicular to the direction of the plurality of flexible cables 160 (e.g., perpendicular to the longitudinal axis 101) to retain the plurality of flexible cables 160 close to one another. Specifically, the stiffener structure 170 may define the same number of holes as the plurality of flexible cables 150 such that each cable of the plurality of flexible cables 160 extends through a corresponding hole of the stiffener structure 170 to maintain each cable in a specific location relative to the other cables. Additionally, the stiffener structure 170 may also define a surface parallel to the direction of the plurality of flexible cables 160 (e.g., parallel to the longitudinal axis 101) extending from the receiving housing 140 along the attachment apparatus 120. The stiffener structure 170 may support the cable apparatus 100 to, e.g., prevent distortion of the cable connector 110 (e.g., the attachment apparatus 120 and/or the receiving housing 140). In one or more embodiments, the stiffener structure 170 may be used to place multiple cable connectors 110 onto the printed circuit board 200 in, e.g., a pre-set horizontal pattern (e.g., to help simplify the assembly process).

Figure 5:
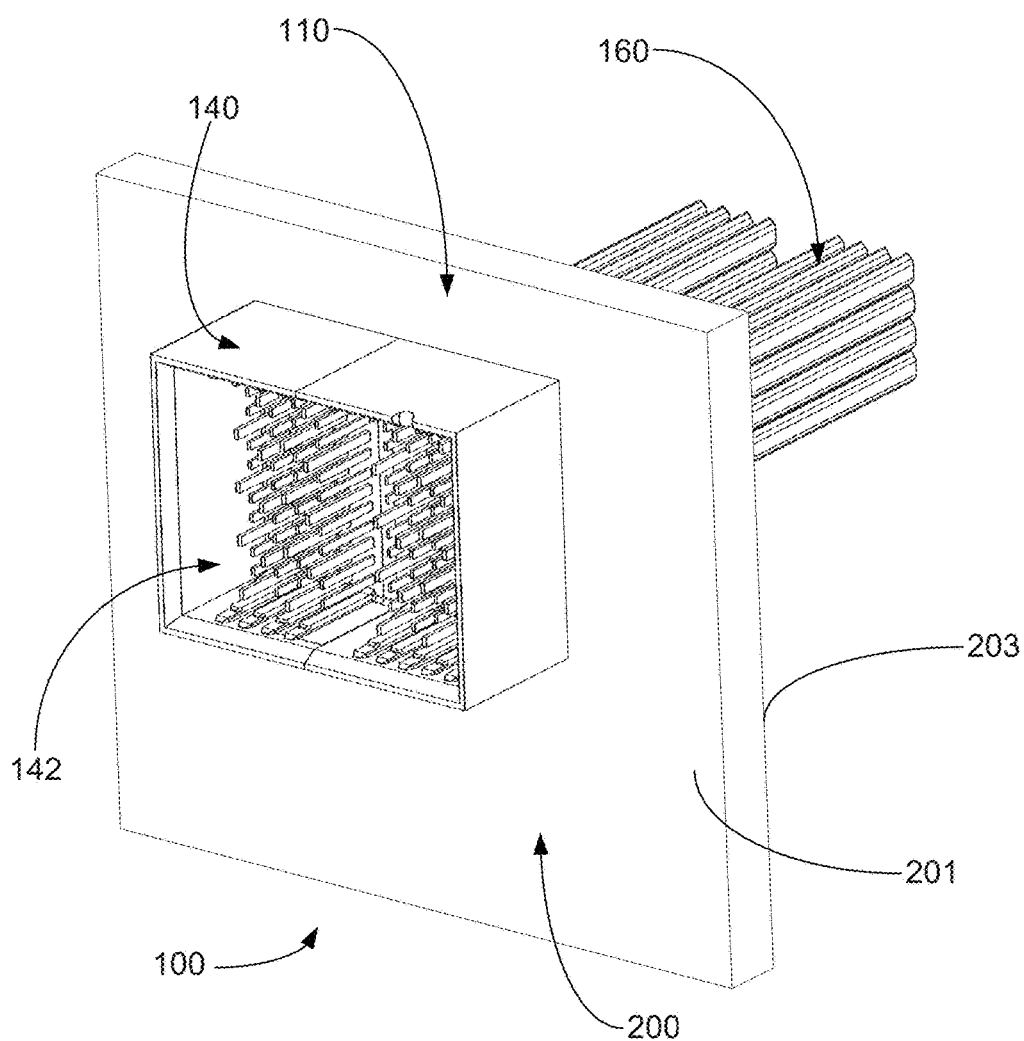
FIG. 5 is a perspective view of an exemplary cable apparatus placed in a midplane of a printed circuit board.

The cable apparatus 100 may also be configured to be attached to a printed circuit board through a vertical midplane as illustrated in FIG. 5. For example, the cable apparatus 100 may extend through the printed circuit board 200 between a first side 201 and a second side 203 (e.g., to connect modules on either side of the board). Specifically, the receiving housing 140 of the cable connector 110 may be located on the first side 201 of the printed circuit board 200 and the attachment apparatus 120 of the cable connector 110 may be located on the second side 203 of printed circuit board 200. The plurality of flexible cables 160 may be positioned through the printed circuit board 200 such that the connecting portion 164 may be positioned in the opening 142 of the receiving housing 140. The attachment apparatus 120 may be attached to the plurality of flexible cables 160 and include at least one prong (not shown in FIG. 5, but as described herein with respect to FIG. 2B) that may be configured to be physically coupled to the printed circuit board 200 (e.g., at the second side 203), thereby physically coupling the cable connector 110 to the midplane. As a result of the orientation of the midplane configuration, the attachment apparatus 120 may extend along a direction perpendicular to the plurality of flexible cables 160 (e.g., at a position proximate the printed circuit board 200) and the at least one prong 130 may extend in the same direction as the plurality of flexible cables 160 (e.g., at a position proximate the printed circuit board 200).

Although at least one prong 130 may extend perpendicular to the direction of the plurality of flexible cables 160. The midplane configuration may allow for alternative system designs by allowing different orientation of components of the cable apparatus 100. Furthermore, the orientation of the attachment apparatus 120 relative to the printed circuit board 200 may allow for the insertion force to be directly towards the midplane printed circuit board 200. On the other hand, in a right-angle orientation, the insertion force may be directed to rotate the attachment apparatus 120 about its rear edge. It is noted that this cable apparatus 100 may be used with any other type of printed circuit board connector configuration (e.g., right angle configuration) now known, or later developed, in the art.

Figure 6:
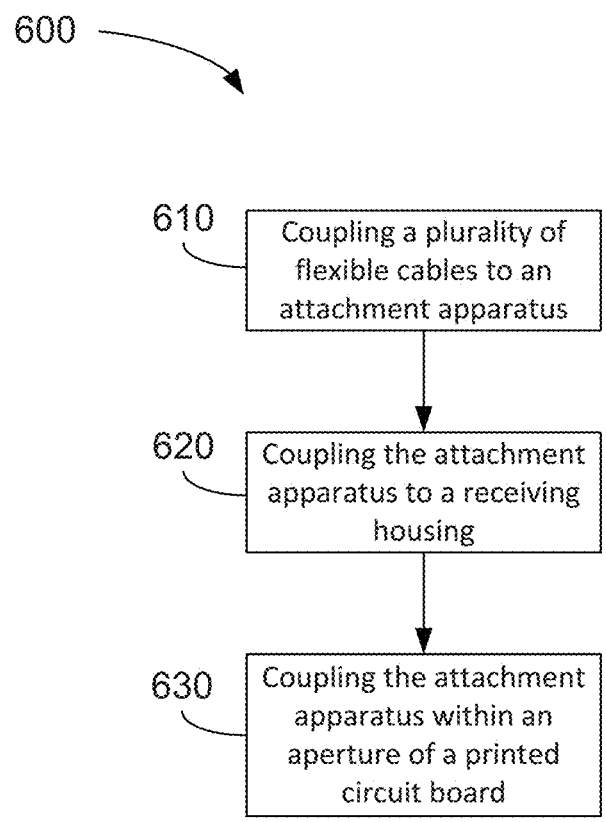
FIG. 6 is a method of coupling a plurality of flexible cables to a printed circuit board using a cable connector.

A method 600 of coupling a plurality of flexible cables to a printed circuit board using a cable connector is illustrated in FIG. 6. The method may include coupling 610 the plurality of flexible cables to an attachment apparatus (of the cable connector) between a first end portion and a second end portion of the attachment apparatus. The attachment apparatus may include opposing attachment edges extending between the first and second end portions and at least one prong extending from one of the opposing attachment edges. Each of the plurality of flexible cables may extend from an end portion including a connecting portion (e.g., to connect to modules or other cables).

The method may also include coupling 620 the attachment apparatus to a receiving housing of the cable connector. In some embodiments, the attachment apparatus may be coupled to the receiving housing after the plurality of flexible cables are coupled to the attachment apparatus. In other embodiments, the attachment apparatus may be coupled to the receiving housing prior to the plurality of flexible cables being coupled to the attachment apparatus. The receiving housing may define an opening and may be coupled to the attachment apparatus such that the connecting portions (of the plurality of flexible cables) may be positioned within the opening. The opening of the receiving housing may be configured to receive an additional connector (e.g., a cable connector, at least one additional cable, etc.) to operably couple the additional connector and the plurality of flexible cables. The method may further include coupling 630 the attachment apparatus within an aperture of the printed circuit board.

In one or more embodiments, the method may also include operably coupling the additional connector and the connecting portion of the plurality of flexible cables through the opening of the receiving housing. In one or more embodiments, coupling 630 the attachment apparatus within the aperture of the printed circuit board may include press fitting (e.g., as described herein) the at least one prong of the attachment apparatus into the aperture of the printed circuit board. In one or more embodiments, the method may also include transmitting a signal between the plurality of flexible cables and the additional connector (e.g., the signal may be transmitted between a module connected at an end of the plurality of flexible cables and a module connected to the additional connector).

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top," "bottom," "above," "below," etc. may be used in this disclosure. These terms should not be construed as limiting the position or orientation of a structure, but should be used as providing spatial relationship between the structures.

Embodiments of the systems, apparatus, structures, devices, and methods are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A cable apparatus configured to be physically coupled to a printed circuit board, the cable apparatus comprising:
   a cable connector comprising an attachment apparatus and a receiving housing, the attachment apparatus comprising at least one prong configured to be coupled within an aperture of the printed circuit board, the receiving housing defining an opening configured to receive an additional connector; and
   a plurality of flexible cables coupled to the cable connector, each of the plurality of flexible cables extending from an end portion comprising a connecting portion, the connecting portions positioned within the opening of the receiving housing and configured to be operably coupled to a corresponding connecting portion of the additional connector received by the opening of the receiving housing.

2. The cable apparatus of claim 1, wherein the at least one prong of the attachment apparatus does not transmit a signal.

3. The cable apparatus of claim 1, wherein the at least one prong is configured to be press-fit within the aperture of the printed circuit board.

4. The cable apparatus of claim 1, wherein the plurality of flexible cables extend into the receiving housing along a longitudinal axis, wherein the at least one prong extends from the attachment apparatus perpendicular to the longitudinal axis.

5. The cable apparatus of claim 1, wherein the attachment apparatus extends between a first end portion and a second end portion, wherein the first end portion is closer to the receiving housing than the second end portion, wherein a length of the attachment apparatus measured between the first end portion and the second end portion is less than or equal to 50 mm.

6. The cable apparatus of claim 1, wherein the plurality of flexible cables are bundled together.

7. The cable apparatus of claim 1, wherein the plurality of flexible cables extend along the attachment apparatus between a first end portion and a second end portion of the attachment apparatus.

8. The cable apparatus of claim 1, wherein the plurality of flexible cables are optical cables.

9. The cable connector of claim 1, further comprising a stiffener structure configured to guide the plurality of flexible cables such that each of the plurality of flexible cables maintains position relative to one another between the cable connector and the stiffener structure.

10. A system comprising:
   a printed circuit board defines a top surface, an opposing bottom surface, and an edge surface extending between the top and bottom surfaces, the printed circuit board further defining an aperture extending into the top surface of the printed circuit board;
   a cable connector comprising at least one prong configured to be coupled within the aperture of the printed circuit board, the cable connector further comprising an attachment apparatus and a receiving housing, the receiving housing defining an opening configured to receive an additional connector, at least a portion of the attachment apparatus is positioned within the receiving housing; and
   a plurality of flexible cables coupled to the cable connector, each of the plurality of flexible cables extending from an end portion comprising a connecting portion, the connecting portions positioned within the opening of the receiving housing and configured to be operably coupled to the additional connector received by the opening of the receiving housing.

11. The system of claim 10, wherein the printed circuit board defines a notch extending into the printed circuit board from the edge surface of the printed circuit board, at least a portion of the cable connector is positioned within the notch such that the plurality of flexible cables are positioned proximate the top surface of the printed circuit board.

12. The system of claim 10, wherein the aperture of the printed circuit board is electrically plated.

13. The system of claim 10, further comprising a data storage device, wherein the plurality of flexible cables are operably connected to the data storage device opposite the end portion of the plurality of flexible cables.

14. The system of claim 10, wherein the at least one prong is configured to be press-fit within the aperture of the printed circuit board.

15. The system of claim 10, wherein the at least one prong does not transmit a signal.

16. A method comprising:
   coupling a plurality of flexible cables to an attachment apparatus between a first end portion and a second end portion of the attachment apparatus, the attachment apparatus comprising opposing attachment edges extending between the first and second end portions and at least one prong extending from one of the opposing attachment edges, each of the plurality of flexible cables extending from an end portion comprising a connecting portion;
   coupling the attachment apparatus to a receiving housing, the receiving housing defining an opening and coupled to the attachment apparatus such that the connecting portions are positioned within the opening, the opening of the receiving housing configured to receive an additional connector to operably couple the additional connector and the plurality of flexible cables; and
   coupling the attachment apparatus within an aperture of a printed circuit board.

17. The method of claim 16, further comprising operably coupling the additional connector and the connecting portion of the plurality of flexible cables through the opening of the receiving housing.

18. The method of claim 16, wherein coupling the attachment apparatus within the aperture of the printed circuit board comprises press fitting at least one prong of the attachment apparatus into the aperture of the printed circuit board.

19. The method of claim 18, wherein the at least one prong of the attachment apparatus does not transmit a signal to the printed circuit board.

20. The method of claim 16, further comprising transmitting a signal between the plurality of flexible cables and the additional connector.

\* \* \* \* \*